United States Patent [19]

Murakami et al.

[11] Patent Number: 5,728,223
[45] Date of Patent: Mar. 17, 1998

[54] REACTANT GAS EJECTOR HEAD AND THIN-FILM VAPOR DEPOSITION APPARATUS

[75] Inventors: Takeshi Murakami, Tokyo; Noriyuki Takeuchi, Hadano; Hiroyuki Shinozaki; Kiwamu Tsukamoto, both of Fujisawa; Yukio Fukunaga; Akihisa Hongo, both of Yokohama, all of Japan

[73] Assignee: Ebara Corporation, Tokyo, Japan

[21] Appl. No.: 662,763

[22] Filed: Jun. 10, 1996

[30] Foreign Application Priority Data

Jun. 9, 1995 [JP] Japan ................. 7-168040

[51] Int. Cl.$^6$ .............................................. C23C 16/00
[52] U.S. Cl. .................................................. 118/715
[58] Field of Search ............................. 118/715, 724

[56] References Cited

U.S. PATENT DOCUMENTS

| | | | |
|---|---|---|---|
| 3,381,114 | 4/1968 | Nakanuma. | |
| 4,401,052 | 8/1983 | Baron | 118/726 |
| 4,625,678 | 12/1986 | Shioya | 118/725 |
| 4,748,135 | 5/1988 | Frijlink | 437/102 |
| 4,980,204 | 12/1990 | Fujii | 118/725 |
| 4,993,358 | 2/1991 | Mahawili | 118/715 |
| 5,284,519 | 2/1994 | Gadgil | 118/725 |

FOREIGN PATENT DOCUMENTS

| | | |
|---|---|---|
| 0 303 508 | 2/1989 | European Pat. Off.. |
| 3715644 | 1/1988 | Germany. |
| 60-189928 | 9/1985 | Japan. |
| 60-192323 | 9/1985 | Japan. |
| 5-299351 | 11/1993 | Japan. |
| 6-10138 | 1/1994 | Japan. |
| 2 219 311 | 12/1989 | United Kingdom. |
| 90/10092 | 9/1990 | WIPO. |

OTHER PUBLICATIONS

U.S. Patent Application Serial No. 08/664,544, filed Jun. 17, 1996, entitled "Thin–Film Vapor Deposition Apparatus", by Hiroyuki Shinozaki et al.

Patent Abstracts of Japan, vol. 014, No. 057 (C–0684), 2 Feb. 1990 & JP–A–01 283375 (Fujitsu Ltd.), 14 Nov. 1989 * abstract *.

Patent Abstracts of Japan, vol. 009, No. 145 (C–287), Jun. 1985 & JP–A–60 027690 (Nippon Shinku Gijutsu KK), 12 Feb. 1985, * abstract *.

Patent Abstracts of Japan, vol. 011, No. 396 (E–568), 24 Dec. 1987 & JP–A–62 158317 (Ulvac Corp), 14 Jul. 1987 * abstract *.

Patent Abstracts of Japan, vol. 015, No. 181 (C–0830), 9 May 1991 & JP–A–03 044470 (Toshiba Corp), 26 Feb. 1991 * abstract *.

Patent Abstracts of Japan, vol. 017, No. 431 (E–1411), 10 Aug. 1993 & JP–A–05 090169 (Hitachi Ltd), 9 Apr. 1993 * abstract *.

IBM Technical Disclosure Bulletin, vol. 22, No. 9, Feb. 1980, New York, U.S., pp. 3972–3973, XP002013842 Anonymous: "Laminar Diffuser Head for Continuous CVD Devices with U–Shaped Carriers. Feb. 1980" * p. 3973, line 3 –line 7 *.

*Primary Examiner*—Richard Bueker
*Attorney, Agent, or Firm*—Wenderoth, Lind & Ponack

[57] ABSTRACT

A reactant gas ejector head in a thin-film vapor deposition apparatus includes at least two reactant gas inlet passages for introducing reactant gases, a gas mixing chamber for mixing reactant gases introduced from the reactant gas inlet passages, and a nozzle disposed downstream of the gas mixing chamber for rectifying the mixed gases from the gas mixing chamber into a uniform flow and applying the uniform flow to a substrate.

28 Claims, 8 Drawing Sheets

REACTANT GAS EJECTOR HEAD AND THIN-FILM VAPOR DEPOSITION APPARATUS

BACKGROUND OF THE INVENTION

1. Field of the Invention

The present invention relates to a thin-film vapor deposition apparatus, and more particularly to a reactant gas ejector head suitable for depositing in a vapor or gas phase a thin film of a high dielectric constant such as of barium/strontium titanate and a thin-film vapor deposition apparatus which includes such a reactant gas ejector head.

2. Description of the Prior Art

Recent years have seen growing efforts in the semiconductor industry to increase the degree of integration of integrated circuits. Such efforts are directed to, among others, the research and development of DRAMs (Dynamic Random-Access Memories) ranging from present megabit storage capabilities to future gigabit storage capabilities. For producing such DRAMs, it is necessary to provide devices having large storage capabilities in small areas. In an attempt to produce dielectric thin films for use in such large storage capability devices, researchers have been shifting their attention from silicon oxide films and silicon nitride films whose dielectric constants are 10 or less to more promising thin film metal oxide materials including tantalum pentoxide ($Ta_2O_5$) whose dielectric constant is about 20, and barium titanate ($BaTiO_3$), strontium titanate ($SrTiO_3$), and mixtures of barium/strontium titanate whose dielectric constants are about 300.

For depositing a thin film of such a metal oxide in a vapor or gas phase, a gas of one or more organic metal compounds and an oxygen-containing gas are mixed with each other, and ejected toward a substrate which has been heated to a certain temperature. Generally, the temperature range for retarding the reaction of the mixture of a gas of an organic metal compound and an oxygen-containing gas is so narrow that the mixture tends to react prematurely when it experiences temperature irregularities while being delivered to the substrate. Therefore, it is preferable to position an inlet pipe for introducing the organic metal compound gas and an inlet pipe for introducing the oxygen-containing gas separately in the vicinity of the substrate, so that the gases introduced by these inlet pipes can rapidly be mixed with each other uniformly to deposit a thin film of metal oxide on the substrate.

Conventional apparatus for separately ejecting the gases near the substrate are disclosed in Japanese laid-open patent publications Nos. 5-299351 and 6-10138, for example. In the apparatus revealed in the former publication, the material gas and the oxygen-containing gas are guided along an inter-wall space and an inner space of a double-walled horn to a region where they are mixed together near the substrate. The apparatus shown in the latter publication introduces the material gas and the oxygen-containing gas into a cone-shaped nozzle tangentially in a cross-section of the nozzle for generating turbulent vortex flows of the gases.

In both of the prior apparatus, the material gas and the oxygen-containing gas are mixed together in a reaction chamber, and hence do not react with each other and do not form reactive products in the gas inlet passages. However, the disclosed apparatus suffer the following drawbacks:

In the apparatus disclosed in Japanese laid-open patent publication No. 5-299351, the gases are mixed with each other at a position near the substrate, and hence do not form reactive products while they are being delivered to the substrate. However, the apparatus fails to provide a uniform downflow which is required to deposit a thin film over a wide substrate surface, and is relatively large in size because its structure has to be high enough to accommodate the double-walled horn.

In the apparatus disclosed in Japanese laid-open patent publication No. 6-10138, the gases cannot sufficiently be mixed with each other even though they are delivered as the turbulent vortex flows. The position where the gases are mixed together is located considerably upstream of the substrate. Therefore, the gases tend to react with each other and create reactive products before they reach the substrate, resulting in a poor quality of the film formed on the substrate.

The conventional apparatus configurations are particularly unable to meet recent demands for higher productivity which can be achieved by increasing substrate dimensions and rotating the substrate at high speed during a vapor deposition process.

SUMMARY OF THE INVENTION

It is therefore an object of the present invention to provide a reactant gas ejector head capable of ejecting a mixed gas of uniform concentration and composition toward a substrate at a controlled flow rate and in a controlled direction.

Another object of the present invention is to provide a thin-film vapor deposition apparatus which includes such a reactant gas ejector head.

According to the present invention, there is provided a reactant gas ejector head for use in a thin-film vapor deposition apparatus, comprising at least two reactant gas inlet passages for introducing reactant gases, a gas mixing chamber for mixing reactant gases introduced from the reactant gas inlet passages, and a nozzle disposed downstream of the gas mixing chamber for rectifying the mixed gases from the gas mixing chamber into a uniform flow and applying the uniform flow to a substrate. The reactant gases introduced from the reactant gas inlet passages are mixed with each other in the gas mixing chamber, and applied from the nozzle to the substrate. Since the reactant gases, i.e., a material gas and an oxidizer gas, are forcibly mixed with each other in the gas mixing chamber, the mixture of the gases has a uniform concentration and composition. The gas mixing chamber is located close to the nozzle. Therefore, any reaction between the gases before they reach the substrate is minimized and the deposited film is free of undesirable contaminations. The deposited film is therefore highly reliable.

The nozzle comprises a constricted passage connected to the gas mixing chamber, and a diffuser connected to the constricted passage and spreading in a direction away from the constricted passage. The constricted passage and the diffuser are effective to rectify the reactant gases into a uniform flow for controlling the direction and pressure thereof before the reactant gases are ejected toward the substrate.

The gas mixing chamber has a deflecting surface positioned in confronting relation to open ends of the reactant gas inlet passages, for deflecting the reactant gases introduced from the reactant gas inlet passages into the gas mixing chamber. The reactant gases introduced from the reactant gas inlet passages are deflected by the deflecting surface, producing turbulent flows which promote the reactant gases to be uniformly mixed with each other.

The deflecting surface has a cross-sectional area which is progressively smaller toward the constricted passage. The deflecting surface is capable of progressively guiding the reactant gases into the constricted passage while the turbulent flows of the reactant gases are mixed with each other.

The deflecting surface may comprise a conical surface. The conical surface produces the turbulent flows when the reactant gases hit the conical surface.

The deflecting surface may comprise a flat surface. The flat surface produces the turbulent flows when the reactant gases hit the flat surface.

The reactant gas inlet passages extend parallel to each other. The reactant gases are introduced from the parallel reactant gas inlet passages into the gas mixing chamber and are mixed with each other in the gas mixing chamber.

The reactant gas inlet passages extend across each other at a predetermined angle. The reactant gases are introduced from the crossing reactant gas inlet passages into the gas mixing chamber, and are directly mixed with each other in the gas mixing chamber.

The reactant gas ejector head further may comprises a plurality of gas mixing chambers for mixing reactant gases introduced from the reactant gas inlet passages, and a plurality of nozzles associated with the respective gas mixing chambers. The reactant gases mixed in the gas mixing chambers are delivered smoothly to the respective nozzles.

The reactant gas ejector head further comprises a unitary nozzle body, the gas mixing chamber and the nozzle being incorporated in the unitary nozzle body. The gas mixing chamber is defined in a surface of the nozzle body, and a diffuser of the nozzle is defined in an opposite surface of the nozzle body. The gas mixing chamber and the diffuser are progressively spread outwardly, and are interconnected by a constricted passage. Since the nozzle body is of a unitary structure, the number of parts used is relatively small, and the reactant gas ejector head can easily be assembled.

The reactant gas ejector head further may comprise a plurality of unitary nozzle bodies, the gas mixing chamber and the nozzle being incorporated in each of the unitary nozzle bodies. The reactant gases are uniformly mixed and flow-rectified by the nozzles, and then ejected to the substrate, which may be of a relatively large area.

The reactant gas ejector head further may comprise a nozzle base, the unitary nozzle bodies being incorporated in the nozzle base. Since the unitary nozzle bodies are incorporated in the nozzle base, the reactant gas ejector head is relatively simple in structure, and can easily be fabricated and assembled.

The reactant gas ejector head further may comprise a distribution base having gas inlet passages for introducing the reactant gases from the reactant gas inlet passages into the gas mixing chambers, the distribution base being mounted on the nozzle base in a laminated structure. The reactant gases introduced from the reactant gas inlet passages are delivered through the gas inlet passages in the distribution base into the gas mixing chambers.

The distribution base may comprise a plate having grooves extending along a surface of the distribution base, and another plate having passages extending across the surface of the distribution base, the grooves and the passages serving the gas inlet passages. The gas inlet passages can easily be machined as the grooves and the passages in the plates.

The reactant gas ejector head further may comprise a heat medium passage for passing a heat medium to maintain the nozzle and/or the gas mixing chamber at a predetermined temperature in the range of from 250° C. to 260° C., for example. The reactant gases thus heated are prevented from reacting with each other prematurely or from being condensed.

According to the present invention, there is also provided a thin-film vapor deposition apparatus which incorporates the reactant gas ejector head described above, and comprises a reaction chamber, the nozzle opening into the reaction chamber, and a substrate stage for holding the substrate in the reaction chamber. In the thin-film vapor deposition apparatus, the reactant gases, i.e., a material gas and an oxidizer gas, are forcibly mixed with each other in the gas mixing chamber before reaching the nozzle, and then flow-rectified in the constricted passage and the diffuser. The mixture of the gases which has a uniform concentration and composition is now ejected under a controlled pressure in a controlled direction toward the substrate in the reaction chamber, so that a thin film of high quality can be deposited on the substrate with a high yield.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1:
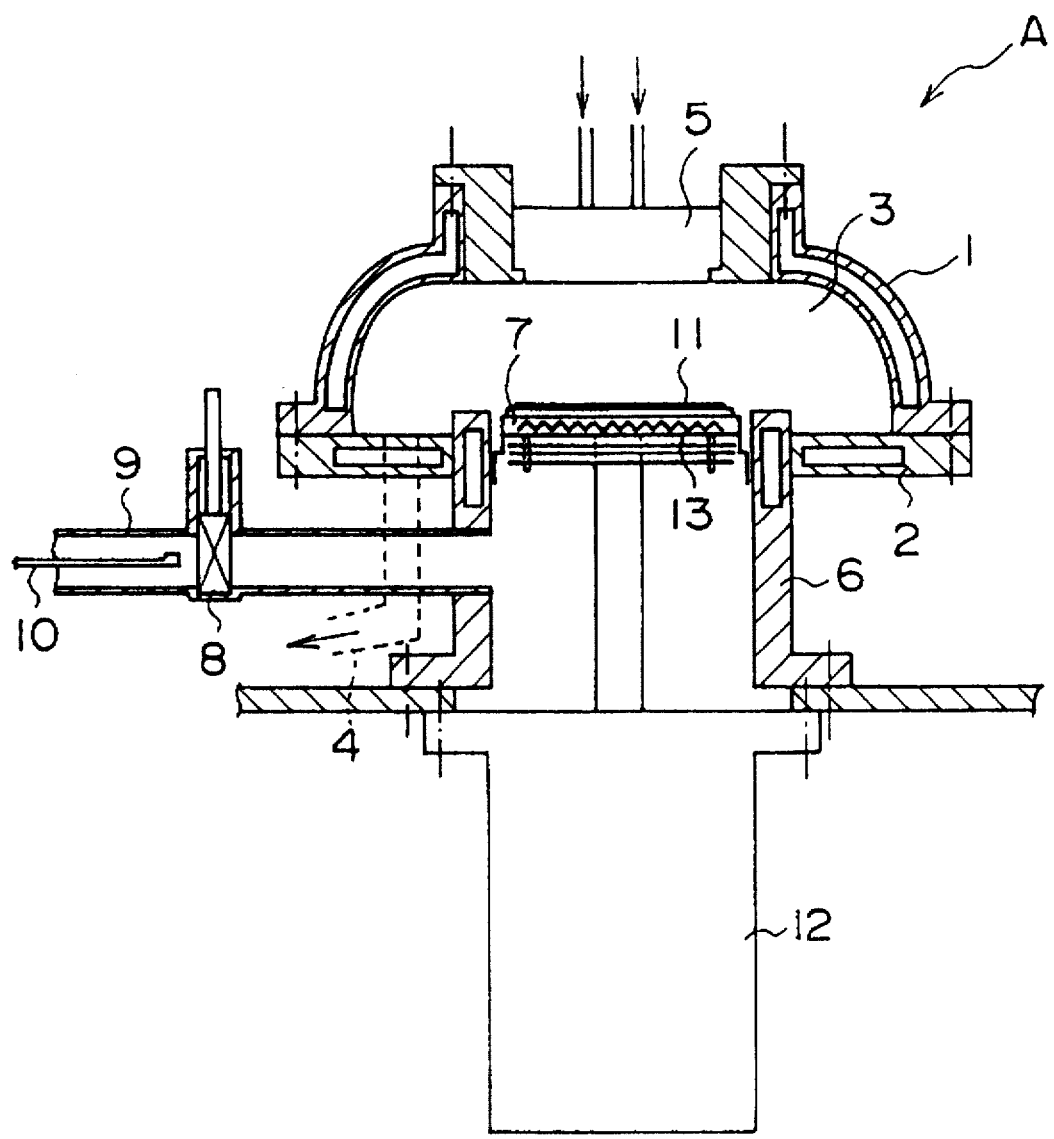
FIG. 1 is a schematic vertical cross-sectional view of a thin-film vapor deposition apparatus according to an embodiment of the present invention.

Like or corresponding parts are denoted by like or corresponding reference numerals throughout the views.

As shown in FIG. 1, a thin-film vapor deposition apparatus A according to an embodiment of the present invention, which incorporates a reactant gas ejector head according to the present invention, has a reaction chamber 3 defined between an inverted-cup shaped reactor 1 and a support base 2 disposed underneath the reactor 1. The reaction chamber 3 is hermetically sealed and has a discharge port 4 for discharging produced gases from the reaction chamber 3. The reactor 1 has a wall with a heat medium passage defined therein for circulating a heat medium to keep the reactor wall and the reaction chamber 3 at a predetermined temperature.

A reactant gas ejector head 5 is mounted in the upper end of the reactor 1. The support base 2 has a central opening defined therein which houses a vertical sleeve 6 projecting downwardly from the support base 2. A substrate stage 7 for supporting a substrate 11 thereon is vertically movably disposed in the vertical sleeve 6. The substrate 11 can be taken into and out of the vertical sleeve 6 through a horizontal feed path 9 having a gate 8 by a robot arm 10. The substrate stage 7 can be lifted and lowered in the vertical sleeve 6 by an actuator mechanism 12 which is attached to the lower end of the vertical sleeve 6. The substrate stage 7 is associated with a heater 13 for heating the substrate 11 mounted on the substrate stage 7 to a predetermined reaction temperature.

Figure 2:
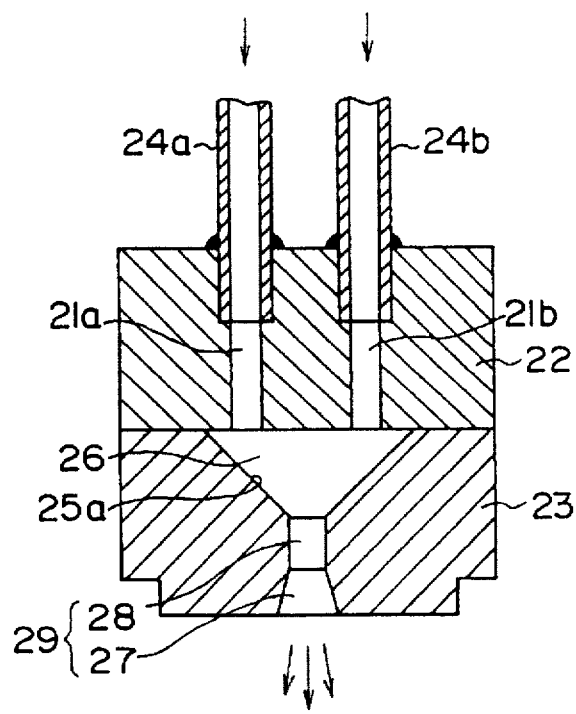
FIG. 2 is a cross-sectional view of a reactant gas ejector head according to an embodiment of the present invention.

FIG. 2 shows a reactant gas ejector head 5 according to a first embodiment of the present invention. The reactant gas ejector head 5 has a single gas mixing chamber and a nozzle. Specifically, the reactant gas ejector head 5 includes a distribution base 22 having a pair of parallel vertical inlet passages 21a, 21b defined therein for introducing reactant gases, i.e., a material gas and an oxidizer gas, and a nozzle body 23 joined to a lower surface of the distribution base 22. The vertical inlet passages 21a, 21b are connected to respective reactant gas supply pipes 24a, 24b which have lower ends inserted into the distribution base 22.

The nozzle body 23 has a gas mixing chamber 26 defined in an upper surface thereof and having a conical surface (deflecting surface) 25a and a diffuser 27 defined in a lower surface thereof and having a tapered surface. The gas mixing chamber 26 has its diameter or cross-sectional area progressively increasing upwardly, and the diffuser 27 has its diameter or cross-sectional area progressively increasing downwardly. The gas mixing chamber 26 and the diffuser 27 are interconnected by a constricted straight passage 28 defined vertically centrally in the nozzle body 23. The diffuser 27 and the constricted straight passage 28 jointly define a nozzle 29. The nozzle 29 and the gas mixing chamber 26 jointly make up the nozzle body 23. The vertical inlet passages 21a, 21b have respective lower ends that are open into the gas mixing chamber 26 at positions confronting the conical surface 25a.

The reactant gases, i.e., the material gas and the oxidizer gas, are introduced from respective sources through the gas supply pipes 24a, 24b and the inlet passages 21a, 21b, and ejected at predetermined rates into the gas mixing chamber 26. The ejected reactant gases are applied to and deflected by the deflecting conical surface 25a. The material gas comprises evaporated gases of solutions of organic metals including $Ba(DPM)_2$, $Sr(DPM)_2$, and $Ti(i-OC_3HT)_4$ which are mixed with a carriage gas of Ar or the like. The oxidizer gas comprises an oxygen-containing gas such as $O_2$, $N_2O$, $H_2O$, or the like which containing ozone ($O_3$) which is generated by an ozonizer.

The reactant gases are deflected by the deflecting conical surface 25a toward the center of the gas mixing chamber 26, producing turbulent flows which join each other and are uniformly mixed with each other in the central region of the gas mixing chamber 26. The reactant gases are then led from the gas mixing chamber 26 through the constricted passage 28 into the diffuser 27. The reactant gases are flow-rectified by the constricted passage 28 and the diffuser 27, and then ejected into the reaction chamber 3 at a predetermined rate. In the reaction chamber 3, the material gas and the oxidizer gas react with each other, forming metal oxide molecules of barium titanate or strontium titanate which are deposited to form a thin film of metal oxide on the substrate 11 which may be a semiconductor wafer. The gases remaining after the reaction and excessive gases are discharged from the reaction chamber 3 through the discharge port 4.

The reactant gases ejected from the reactant gas ejector head 5 have already been forcibly mixed with each other in the gas mixing chamber 26, and are flow-rectified by the nozzle 29, and then applied as a uniform downflow to the substrate 11 on the substrate stage 7. This allows a thin film of high quality which is free from contaminations to be deposited at a high rate on the substrate 11. The deflecting conical surface 25a can easily be machined in the nozzle body 23, and is sufficiently capable of forcibly mixing the reactant gases with each other in the gas mixing chamber 26.

Figure 3:
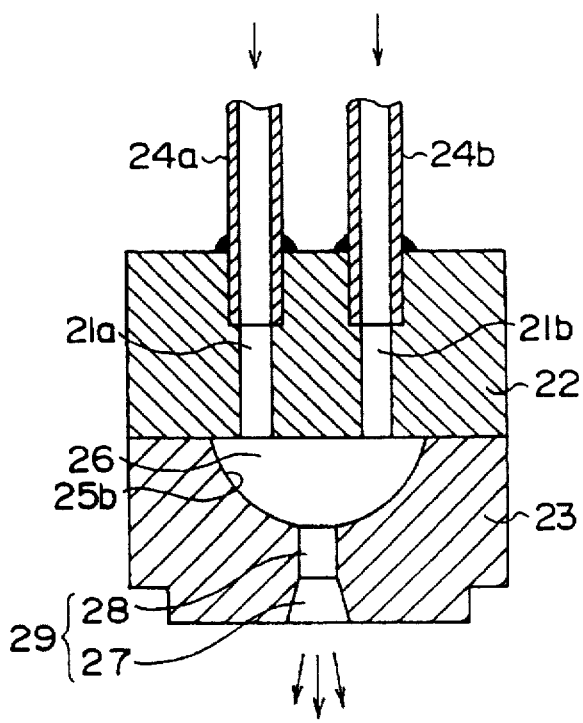
FIG. 3 is a cross-sectional view of a reactant gas ejector head according to another embodiment of the present invention.

FIG. 3 shows a reactant gas ejector head 5 according to a second embodiment of the present invention. The reactant gas ejector head shown in FIG. 3 has a gas mixing chamber 26 of a different shape. Specifically, the gas mixing chamber 26 has a partly spherical surface 25b as a deflecting surface whose diameter progressively increases upwardly.

Figure 4A:
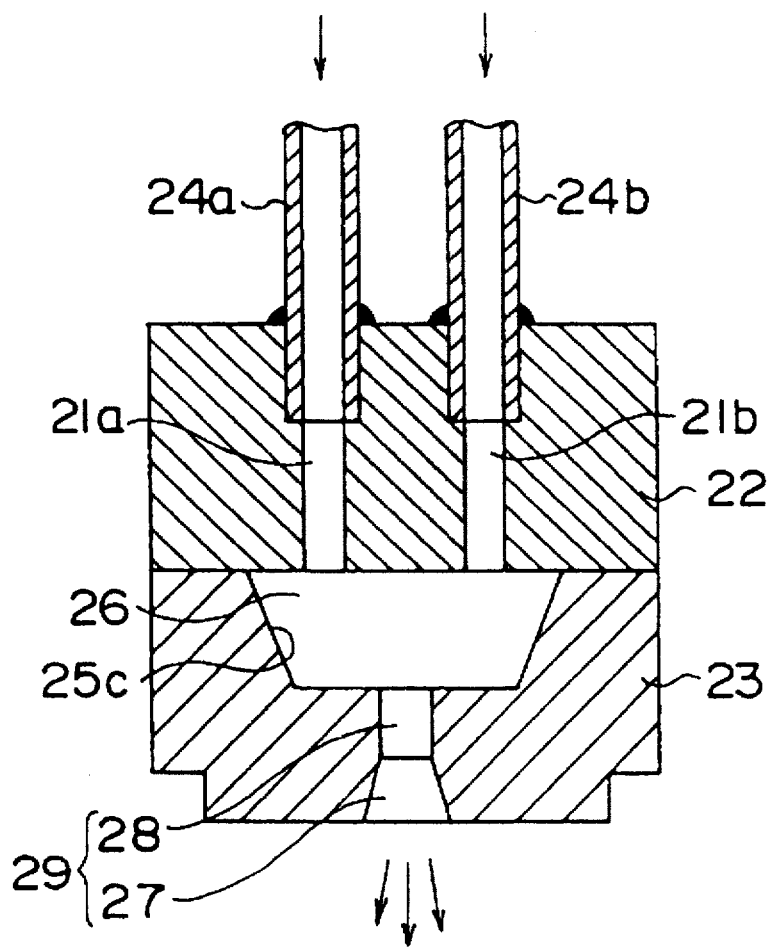
FIG. 4A is a cross-sectional view of a reactant gas ejector head according to another embodiment of the present invention.
Figure 4B:
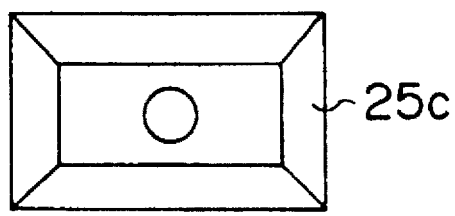
FIG. 4B is a plan view of a deflecting surface of a nozzle of the reactant gas ejector head shown in FIG. 4A.
Figure 5:
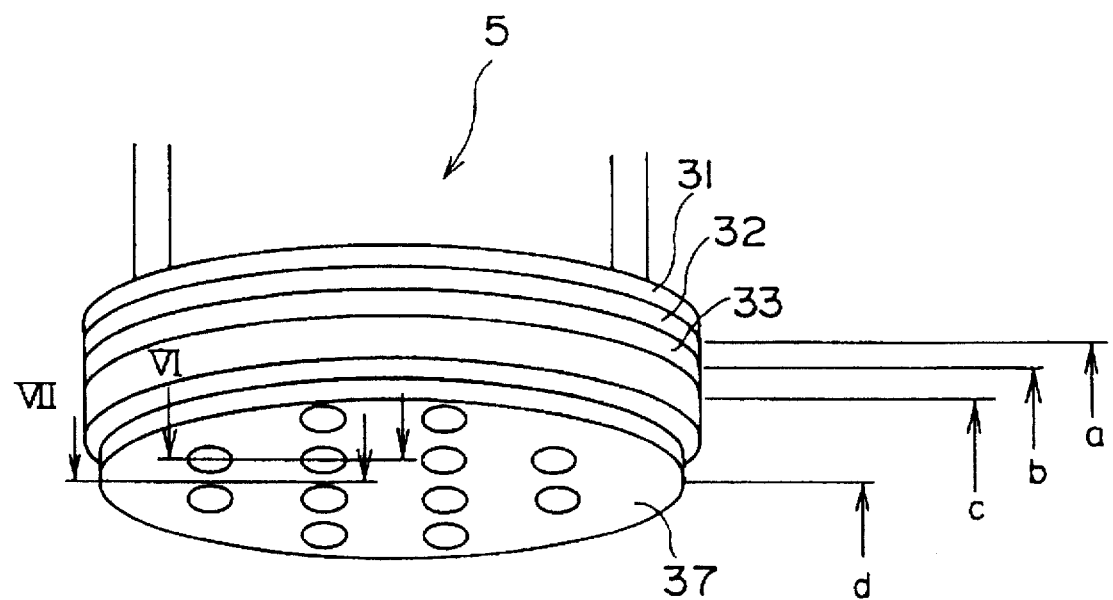
FIG. 5 is a perspective view of a reactant gas ejector head according to another embodiment of the present invention.

FIGS. 4A and 4B show a reactant gas ejector head 5 according to a third embodiment of the present invention. The reactant gas ejector head shown in FIG. 4A has a gas mixing chamber 26 of another different shape. Specifically, the gas mixing chamber 26 has a truncated pyramid shape and flat deflecting surfaces 25c spreading upwardly.

The gas mixing chamber according to the present invention may have any of various shapes and sizes which can be selected depending on conditions in which to eject the reactant gases into the reaction chamber 3.

Figure 6:
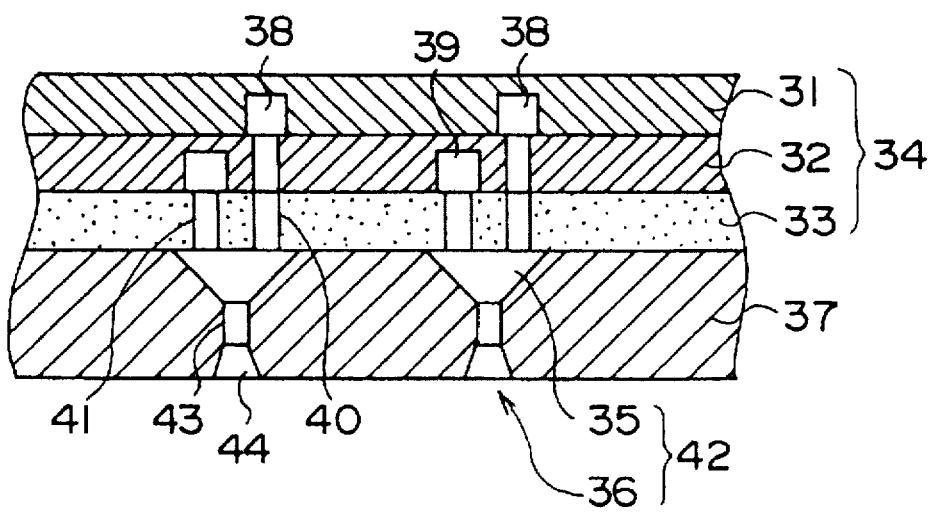
FIG. 6 is a cross-sectional view taken along line VI—VI of FIG. 5.
Figure 7:
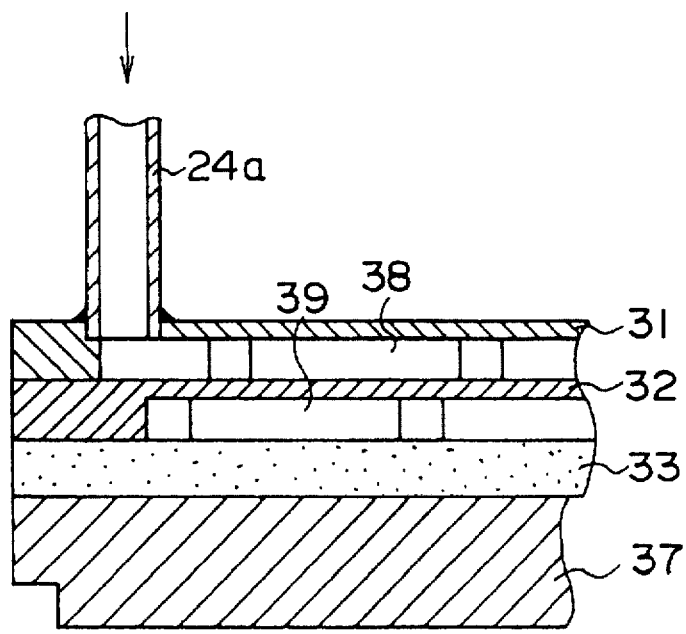
FIG. 7 is a cross-sectional view taken along line VII—VII of FIG. 5.

FIGS. 5 through 8A–8D show a reactant gas ejector head 5 according to a fourth embodiment of the present invention. According to the fourth embodiment, the reactant gas ejector head 5 includes a nozzle base 37 which has a plurality of nozzle bodies 42 for applying uniform gas flows to a substrate 11 which is of a relatively large size. As shown in FIG. 6, the reactant gas ejector head 5 also includes a distribution base 34 comprising first, second, and third plates 31, 32, 33 mounted on the nozzle base 37 for distributing reactant gases into gas mixing chambers 35. The nozzle base 37 is attached to a lower surface of the lowermost third plate 33. The nozzle bodies 42 are arranged in a uniform horizontal two-dimensional pattern in the nozzle base 37, and each comprises a gas mixing chamber 35 and a nozzle 36.

The gas mixing chamber 35 and the nozzle 36 of each of the nozzle bodies 42 are identical in structure to those shown in FIG. 2. In the fourth embodiment, the nozzle base 37 is directly machined to fabricate the gas mixing chambers 35 and the nozzles 36. However, a plurality of separate units each having a gas mixing chamber 35 and a nozzle 36 may be assembled in the nozzle base 37.

The first plate 31 has distribution passages 38 defined therein for introducing an oxidizer gas from a gas supply pipe 24a (see also FIG. 7) to positions corresponding to the respective gas mixing chambers 35. The second plate 32 has distribution passages 39 defined therein for introducing a material gas from a gas supply pipe 24b to positions corresponding to the respective gas mixing chambers 35. The third plate 33 has through holes 40, 41 defined as inlet passages therein which connect the distribution passages 38, 39 to the gas mixing chambers 35. The first, second, and third plates 31, 32, 33 are mounted as a laminated structure on the nozzle base 37. Each of the distribution passages 38, 39 in the first and second plates 31, 32 is defined as a downwardly open groove of rectangular cross section. The lower openings of the distribution passages 38, 39 are covered with the second and third plates 32, 33 except for the through holes 40, 41 which are connected to the lower openings of the distribution passages 38, 39, thus providing the inlet passages.

Figure 8B:
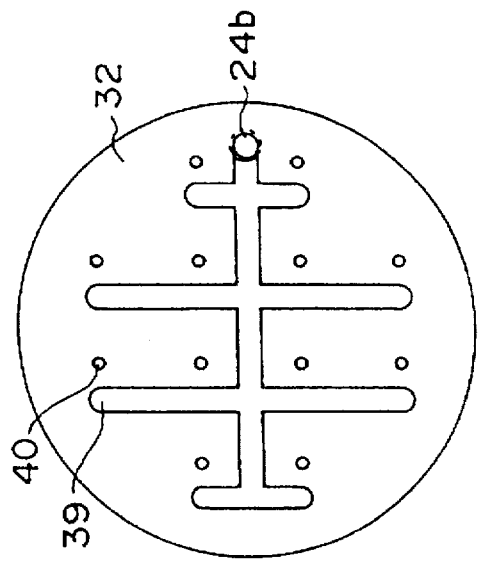
FIGS. 8A, 8B, 8C, and 8D are bottom views as viewed in the directions indicated by the arrows a, b, c, and d in FIG. 5.
Figure 8D:
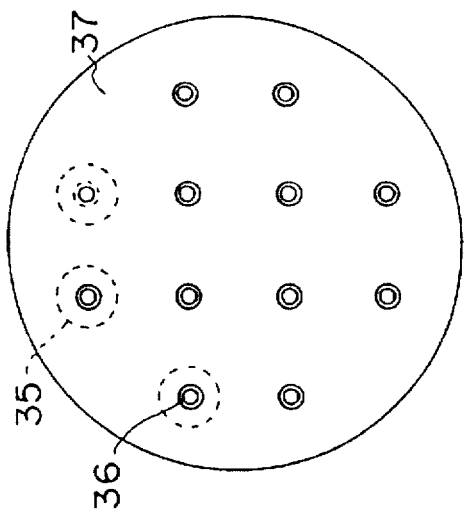
Figure 8A:
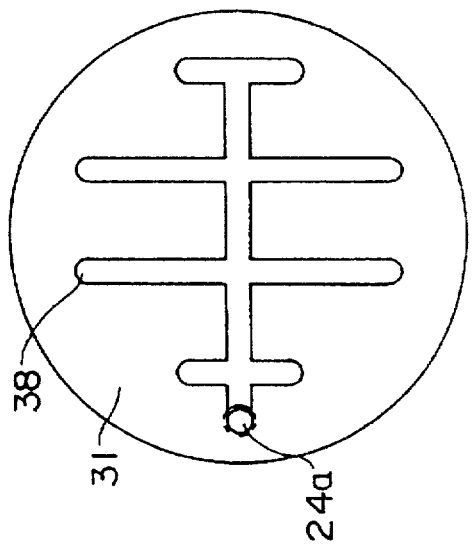
Figure 8C:
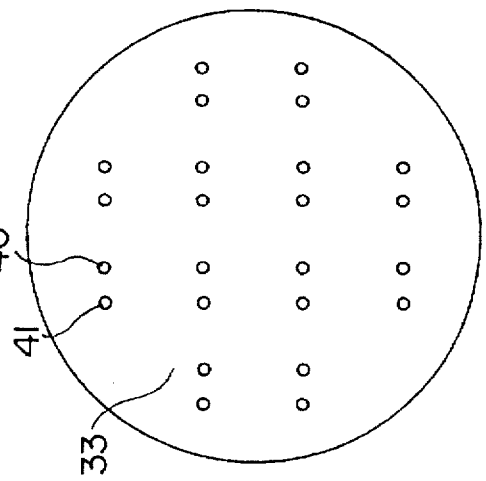

FIGS. 8A through 8D illustrate horizontal two-dimensional patterns of the distribution passages 38, 39, the through holes 40, 41, the gas mixing chambers 35, and the nozzles 36. As shown in FIGS. 8A and 8B, the distribution passages 38, 39 are branched from junction ports connected to the gas supply pipes 24a, 24b. The distribution passages 38, 39 extend in patterns corresponding to the nozzles 36 and the gas mixing chambers 35 in the nozzle base 37, and may be branched in any of various patterns insofar as they correspond to the nozzles 36 and the gas mixing chambers 35. The position and number of the junction ports connected to the gas supply pipes 24a, 24b may be selected as desired. The first, second, and third plates 31, 32, 33 may be joined together by welding, pressing, bolt fastening, bonding, or the like.

In the reactant gas ejector head 5 according to the fourth embodiment, the material and oxidizer gases supplied from the gas supply pipes 24a, 24b are introduced through the distribution passages 38, 39 and the through holes 40, 41 into the gas mixing chambers 35, in which the material and oxidizer gases are mixed together. The reactant gases are then flow-rectified by constricted passages 43 and diffusers 44 of the nozzles 36, and ejected from the reactant gas ejector head 5 into the reaction chamber.

According to the fourth embodiment, since the nozzles 36 are uniformly distributed in the nozzle base 37, they can apply controlled gas flows in a wide spatial range to the substrate 11 for thereby depositing a thin film on the substrate 11 at a high speed with a high yield.

Furthermore, the inlet passages for introducing the reactant gases are provided by the grooves in the plates and the through holes in the plates. Therefore, a complex pattern of such inlet passages can be produced relatively simply by machining the plates. While the two reactant gases, i.e., the material gas and the oxidizer gas, are employed in the reactant gas ejector head according to the fourth embodiment, the reactant gas ejector head may include three or more groups of distribution passages and hence plates if a plurality of material gases are employed.

Figure 9:
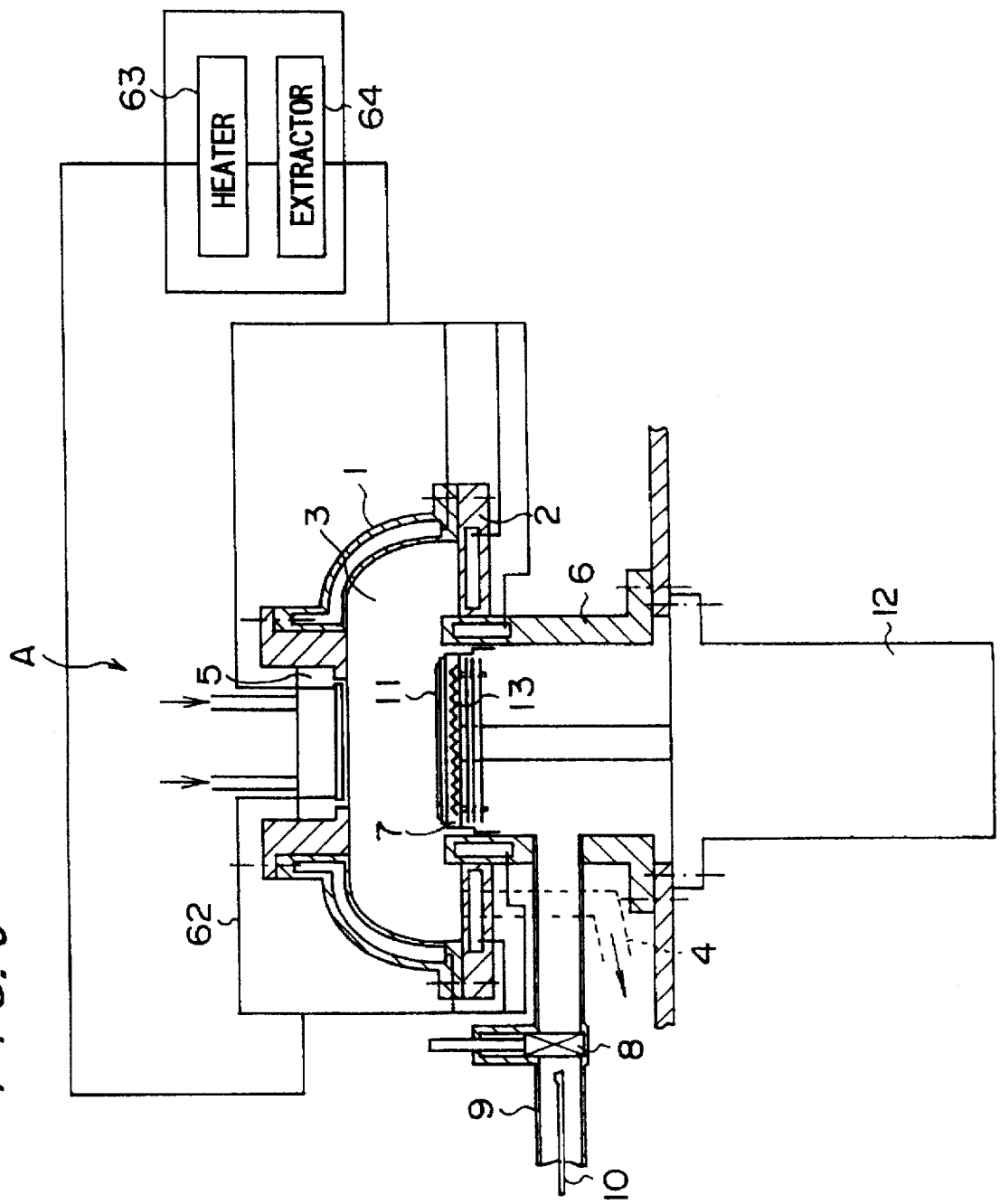
FIG. 9 is a schematic vertical cross-sectional view of a thin-film vapor deposition apparatus according to another embodiment of the present invention.
Figure 10:
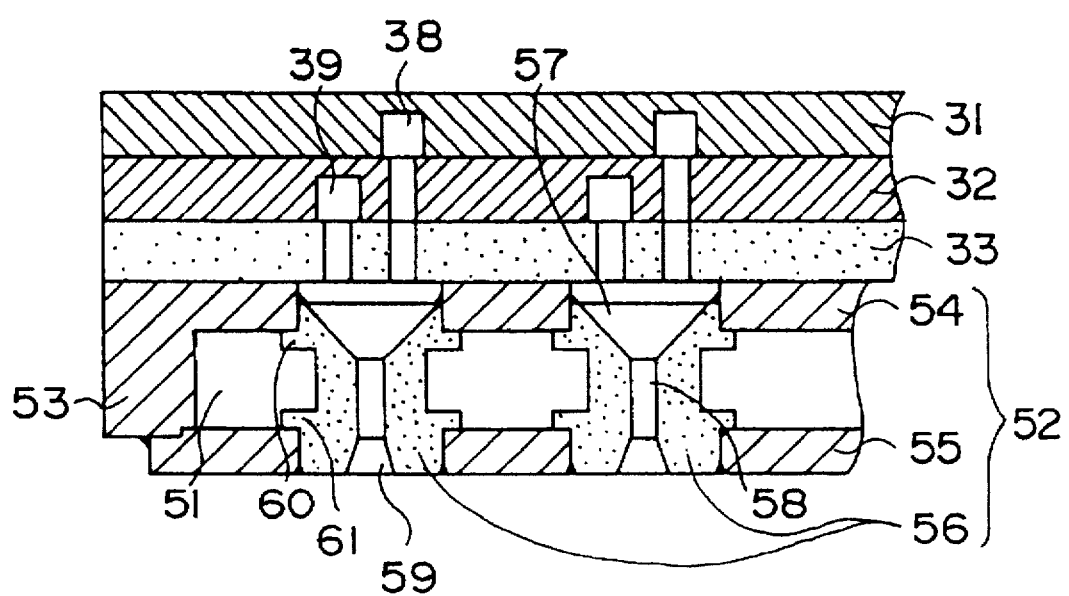
FIG. 10 is a cross-sectional view of a reactant gas ejector head according to another embodiment of the present invention.

FIGS. 9 and 10 show a thin-film vapor deposition apparatus according to another embodiment of the present invention. The thin-film vapor deposition apparatus according to this embodiment has a heat medium passage 51 (see FIG. 10) defined in a reactant gas ejector head 5 for keeping the reactant gas ejector head 5 at a constant temperature. Specifically, the reactant gas ejector head 5 includes a nozzle base 52 having an upper plate 54 including a side wall 53, a lower plate 55, and a plurality of nozzle bodies 56 fitted in and disposed between the upper and lower plates 54, 55. Each of the nozzle bodies 56 comprises a cylindrical body having a gas mixing chamber 57, a constricted passage 58, and a diffuser 59. The cylindrical body of each of the nozzle bodies 56 has an upper flange 60 held against the upper plate 54 and a lower flange 61 held against the lower plate 55. The upper and lower plates 54, 55 are vertically spaced from each other, defining the heat medium passage 51 therebetween which accommodates the nozzle bodies 56. The heat medium passage 51 is supplied with a heat medium from a heat medium source that is connected through a heat medium pipe 62 (see FIG. 9).

As shown in FIG. 9, the heat medium is also supplied through the heat medium pipe 62 to heat medium passages defined in the reactor 1, the support base 2, and sleeve 6 which surround the reaction chamber 3. Part of the heat medium supplied through the heat medium pipe 62 is also supplied to the reactant gas ejector head 5. The heat medium pipe 62 is combined with a heater 63 for heating the heat medium to a predetermined temperature and an extractor 64 such as a pump for extracting the heat medium from the heat medium passages defined in the reactor 1, the support base 2, and sleeve 6.

As shown in FIG. 10, the reactant gas ejector head 5 has first, second, and third plates 31, 32, 33 which are identical in structure to those shown in FIG. 6.

With the arrangement of the present invention, since the material gas and the oxidizer gas are forcibly mixed with each other in the gas mixing chamber to uniformize the concentration and composition of the mixed gases, and then are flow-rectified by the nozzle and ejected to the substrate, any reaction between the gases before they reach the substrate is minimized and the deposited film is free of undesirable contaminations. The deposited film is therefore highly reliable. The reactant gas ejector head can produce gas flows under a controlled pressure in a controlled direction which are suitable for the size of the substrate and the materials of the film to be deposited on the substrate. Since the nozzle body comprises a unitary structure including an integral assembly of the nozzle and the gas mixing chamber, it is of a simple structure and a compact size for accelerating the mixing of the gases, and is effective in reducing the cost of the reactant gas ejector head and hence the thin-film vapor deposition apparatus. In the case where the nozzle base comprises a plurality of nozzles, the reactant gas ejector head can create a uniform downflow of gases applied vertically to the substrate over a wide substrate surface. Consequently, it is possible to deposit thin films on large-size substrates or semiconductor wafers, and the production efficiency and yield can be increased. Inasmuch as the heat medium passage for heating the nozzle base is of a simple structure that can easily be incorporated in the reactant gas ejector head, the thin-film vapor deposition apparatus can produce dielectric thin films of a high dielectric constant which require the reactant gases to be stable with respect to temperatures.

Although certain preferred embodiments of the present invention have been shown and described in detail, it should be understood that various changes and modifications may be made therein without departing from the scope of the appended claims.

What is claimed is:

1. A reactant gas ejector head for use in providing a reactant gas flow toward a substrate to be arranged in a reaction chamber for depositing a thin film thereon, said head comprising:

a plurality of gas mixing chambers distributed in a plane to extend substantially parallel to the substrate for mixing reactant gases;

each said gas mixing chamber having connected thereto respective at least two reactant gas inlet passages capable of introducing different types of reactant gases to said each gas mixing chamber individually; and each said gas mixing chamber having connected thereto a respective ejection nozzle for ejecting reactant gases mixed in said each gas mixing chamber onto the substrate.

2. A reactant gas ejector head according to claim 1, wherein said gas mixing chambers are uniformly distributed in said plane.

3. A reactant gas ejector head according to claim 1, wherein said gas mixing chambers are distributed in said plane in a pattern.

4. A reactant gas ejector head according to claim 1, wherein each said nozzle comprises a constricted passage connected to said gas mixing chamber, and a diffuser connected to said constricted passage and diverging in a direction away from said constricted passage.

5. A reactant gas ejector head according to claim 4, wherein each said gas mixing chamber has a deflecting surface positioned in confronting relation to open ends of said respective reactant gas inlet passages thereof for deflecting the reactant gases introduced from said respective reactant gas inlet passages into said each gas mixing chamber.

6. A reactant gas ejector head according to claim 5, wherein said deflecting surface has a cross-sectional area which is progressively smaller toward the respective said constricted passage.

7. A reactant gas ejector head according to claim 6, wherein said deflecting surface comprises a conical surface.

8. A reactant gas ejector head according to claim 6, wherein said deflecting surface comprises a pyramid-shaped surface.

9. A reactant gas ejector head according to claim 6, wherein said deflecting surface comprises a partially spherical surface.

10. A reactant gas ejector head according to claim 1, wherein each said gas mixing chamber and said respective ejection nozzle are constructed as a unitary, one-piece nozzle body.

11. A reactant gas ejector head according to claim 10, wherein plural unitary nozzle bodies of said plurality of gas mixing chambers and respective ejection nozzles are incorporated in a single nozzle base.

12. A reactant gas ejector head according to claim 11, further comprising a distribution base mounted on said nozzle base and defining said reactant gas inlet passages.

13. A reactant gas ejector head according to claim 12, wherein said distribution base comprises a plate having grooves formed in a surface thereof, and another plate having passages extending therethrough.

14. A reactant gas ejector head according to claim 1, further comprising a heat medium passage for passage of a heat medium to maintain at least one of said nozzle and said gas mixing chamber at a predetermined temperature.

15. A thin-film vapor deposition apparatus comprising:
   a reaction chamber;
   a substrate holder for supporting a substrate in said reaction chamber; and
   a reaction gas ejector head for providing a reactant gas flow toward the substrate supported by said substrate holder, said reaction gas ejector head comprising:
      a plurality of gas mixing chambers distributed in a plane extending substantially parallel to a plane of the substrate when supported by said substrate holder for mixing reactant gases;
      each said gas mixing chamber having connected thereto respective at least two reactant gas inlet passages capable of introducing different types of reactant gases to said each gas mixing chamber individually; and
      each said gas mixing chamber having connected thereto a respective ejection nozzle for ejecting reactant gases mixed in said each gas mixing chamber onto the substrate.

16. A thin-film vapor deposition apparatus according to claim 15, wherein said gas mixing chambers are uniformly distributed in said plane.

17. A thin-film vapor deposition apparatus according to claim 15, wherein said gas mixing chambers are distributed in said plane in a pattern.

18. A thin-film vapor deposition apparatus according to claim 15, wherein each said nozzle comprises a constricted passage connected to the respective said gas mixing chamber, and a diffuser connected to said constricted passage and diverging in a direction away from said constricted passage.

19. A thin-film vapor deposition apparatus according to claim 18, wherein each said gas mixing chamber has a deflecting surface positioned in confronting relation to open ends of said respective reactant gas inlet passages thereof for deflecting the reactant gases introduced from said respective reactant gas inlet passages into said each gas mixing chamber.

20. A thin-film vapor deposition apparatus according to claim 19, wherein said deflecting surface has a cross-sectional area which is progressively smaller toward the respective said constricted passage.

21. A thin-film vapor deposition apparatus according to claim 20, wherein said deflecting surface comprises a conical surface.

22. A thin-film vapor deposition apparatus according to claim 20, wherein said deflecting surface comprises a pyramid-shaped surface.

23. A thin-film vapor deposition apparatus according to claim 20, wherein said deflecting surface comprises a partially spherical surface.

24. A thin-film vapor deposition apparatus according to claim 15, wherein each said gas mixing chamber and said respective ejection nozzle are constructed as a unitary nozzle body.

25. A thin-film vapor deposition apparatus according to claim 24, wherein plural unitary nozzle bodies of said plurality of gas mixing chambers and respective ejection nozzles are incorporated in a single nozzle base.

26. A thin-film vapor deposition apparatus according to claim 24, further comprising a distribution base mounted on said nozzle base and defining said reactant gas inlet passages.

27. A thin-film vapor deposition apparatus according to claim 26, wherein said distribution base comprises a plate having grooves formed in a surface thereof, and another plate having passages extending therethrough.

28. A thin-film vapor deposition apparatus according to claim 15, further comprising a heat medium passage for passage of a heat medium to maintain at least one of said nozzle and said gas mixing chamber at a predetermined temperature.

* * * * *